(12) United States Patent
Jiang et al.

(10) Patent No.: US 6,924,761 B2
(45) Date of Patent: Aug. 2, 2005

(54) DIFFERENTIAL DIGITAL-TO-ANALOG CONVERTER

(75) Inventors: Xuewen Jiang, Phoenix, AZ (US); Bobby B. Nikjou, Tempe, AZ (US); Waleed Khalil, Tempe, AZ (US); Syed R. Naqvi, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 55 days.

(21) Appl. No.: 10/601,038

(22) Filed: Jun. 19, 2003

(65) Prior Publication Data
US 2004/0257254 A1 Dec. 23, 2004

(51) Int. Cl.$^7$ ............................................. H03M 1/78
(52) U.S. Cl. ......................................... 341/154; 341/144
(58) Field of Search ................................. 341/144, 145, 341/154, 118, 120, 122

(56) References Cited

U.S. PATENT DOCUMENTS

| | | | | |
|---|---|---|---|---|
| 5,455,582 A | * | 10/1995 | Valdenaire | 341/154 |
| 5,648,780 A | * | 7/1997 | Neidorff | 341/154 |
| 5,841,384 A | * | 11/1998 | Herman et al. | 341/138 |
| 6,268,817 B1 | * | 7/2001 | Min et al. | 341/145 |
| 6,407,690 B1 | * | 6/2002 | Yamamoto et al. | 341/154 |
| 6,414,616 B1 | * | 7/2002 | Dempsey | 341/144 |
| 6,633,246 B1 | * | 10/2003 | Bowers | 341/136 |
| 6,650,881 B1 | * | 11/2003 | Dogan | 455/276.1 |
| 6,693,491 B1 | * | 2/2004 | Delano | 330/282 |

* cited by examiner

*Primary Examiner*—Michael Tokar
*Assistant Examiner*—Linh V. Nguyen
(74) *Attorney, Agent, or Firm*—Blakely, Sokoloff, Taylor & Zafman LLP

(57) ABSTRACT

Briefly, in accordance with one embodiment of the invention, a differential digital-to-analog converter utilized in a transmitter path of a transceiver utilizes a differential R2R architecture. Such a differential digital-to-analog converter may be utilized in higher speed, lower power and higher resolution applications with a higher area efficiency, for example in a WCDMA application.

18 Claims, 4 Drawing Sheets

DIFFERENTIAL DIGITAL-TO-ANALOG CONVERTER

DESCRIPTION OF THE DRAWING FIGURES

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
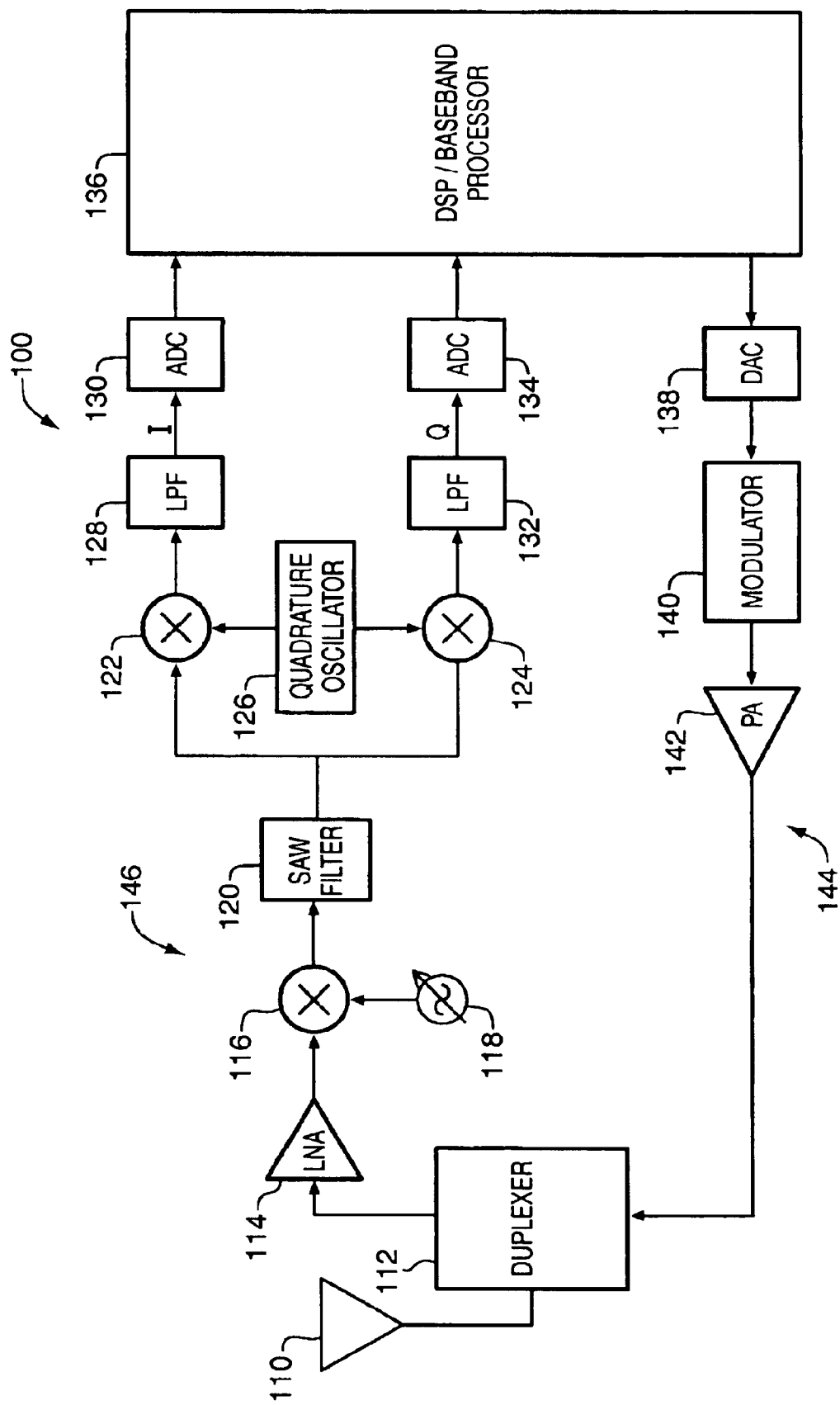
FIG. 1 is a block diagram of a transceiver utilizing a differential digital-to-analog converter in accordance with one embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

It should be understood that embodiments of the present invention may be used in a variety of applications. Although the present invention is not limited in this respect, the circuits disclosed herein may be used in many apparatuses such as in the transmitters and receivers of a radio system. Radio systems intended to be included within the scope of the present invention include, by way of example only, wireless local area networks (WLAN) devices and wireless wide area network (WWAN) devices including wireless network interface devices and network interface cards (NICs), base stations, access points (APs), gateways, bridges, hubs, cellular radiotelephone communication systems, satellite communication systems, two-way radio communication systems, one-way pagers, two-way pagers, personal communication systems (PCS), personal computers (PCs), personal digital assistants (PDAs), and the like, although the scope of the invention is not limited in this respect.

Types of wireless communication systems intended to be within the scope of the present invention include, although not limited to, Wireless Local Area Network (WLAN), Wireless Wide Area Network (WWAN), Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems such as Wideband CDMA (WCDMA), CDMA-2000, and the like, although the scope of the invention is not limited in this respect.

Referring now to FIG. 1, a block diagram of a transceiver utilizing a differential digital-to-analog converter in accordance with one embodiment of the present invention will be discussed. Transceiver 100 may be utilized in a communication device such as a portable cellular telephone receiver, for example a GSM, WLAN or a WCDMA device, although the scope of the invention is not limited in this respect. Transceiver 100 may include one or more antennas 110 coupled to a duplexer 112 that combines the transmitter path 144 and receiver path 146 of transceiver 100. Duplexer 112 may include impedance matching circuitry to allow transmitter path 144 and receiver path 146 to share a common antenna or antennas 110. In receiver path 146, duplexer 112 may couple to a low noise amplifier (LNA) 114 to amplify a radio-frequency (RF) signal received at antenna 110, and which in turn may couple to a demodulator 116 and a local oscillator 118 to convert the received RF signal to an intermediate-frequency (IF) signal. Local oscillator 118 may be variable to tune receiver path 146 to a desired carrier frequency of the received RF signal. An IF filter 120 such as a surface acoustic wave (SAW) filter may be used to select the desired intermediate frequency range 120 from the output of mixer 116. The output of IF filter 120 may be passed through a demodulator stage which may include demodulators 122 and 124 coupled to a quadrature oscillator 126 to convert the IF signal into in-phase (I) and quadrature (Q) components or to low intermediate-frequency (LIF) signal. Filters 128 and 132 may be utilized to filter the undesired frequency components from the outputs of demodulators 122 and 124, respectively. The I and Q or LIF signals may be sent through analog-to-digital converters 130 and 134 to be received and processed by a baseband processor 136 which may be a digital signal processor (DSP) or which may include a digital signal processor or a digital signal processor like sub-block as a component thereof, although the scope of the invention is not limited in this respect.

In transmitter path 144, baseband processor 136 may provide a digitally modulated signal to a digital-to-analog converter (DAC) 138 which may in turn provide a signal to be modulated for transmission to modulator 140. The analog output of DAC 138 may be provided to a reconstruction filter followed by a programmable gain amplifier (not shown). At modulator block 140, the output signal of the programmable gain amplifier may then be upconverted to radio-frequency (RF) by mixing the signal with a signal from a local oscillator. The RF output signal may then be fed to a power amplifier (PA) 142 to provide an output signal to duplexer 112 and antenna 110 for radio-frequency transmission, although the scope of the invention is not limited in this respect In one embodiment of the invention, filters 128 and 132 may be implemented by a programmable filter wherein the filter response of the filters may be controlled by baseband processor 136 in accordance with a desired mode of operation of transceiver 100, although the scope of the invention is not limited in this respect.

Figure 2:
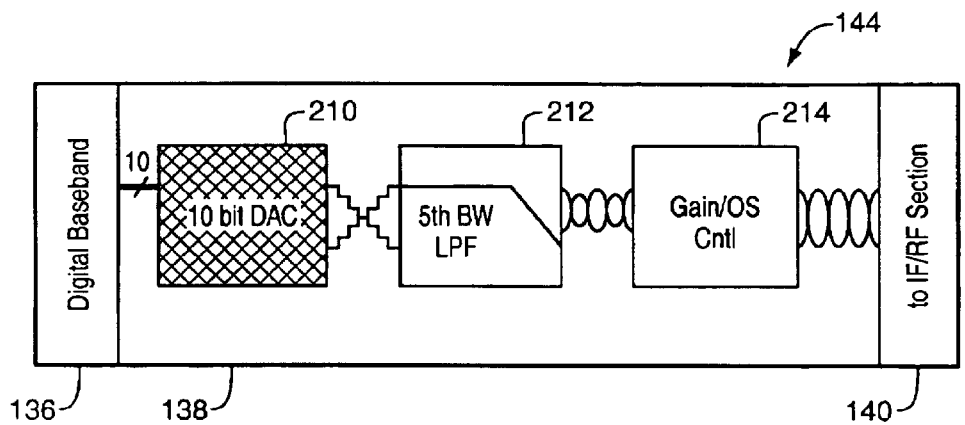
FIG. 2 is a block diagram of a transmitter path of a transceiver utilizing a differential digital-to-analog converter in accordance with one embodiment of the present invention.

Referring now to FIG. 2, a block diagram of a transmitter path of a transceiver utilizing a differential digital-to-analog converter in accordance with one embodiment of the present invention will be discussed. In one embodiment of the invention, transmitter path 144 may receive a digital output from baseband processor 136 to be converted from a digital signal into an analog signal at digital-to-analog converter (DAC) block 138. As shown in FIG. 2, transmit path 144 may include at least a portion of an analog front end (AFE) of transceiver 100, which may include a digital-to-analog converter (DAC) 210, a low pass filter 212 and a gain and offset control circuit 214. In one particular embodiment, DAC 210 may be a 10-bit digital-to-analog converter and lowpass filter 212 may be a fifth order Butterworth filter 212, although the scope of the invention is not limited in this respect. The output of gain and offset control circuit 214 may be passed to the IF/RF section of transmitter path 144 via modulator 140 for transmission of the signal.

Figure 3:
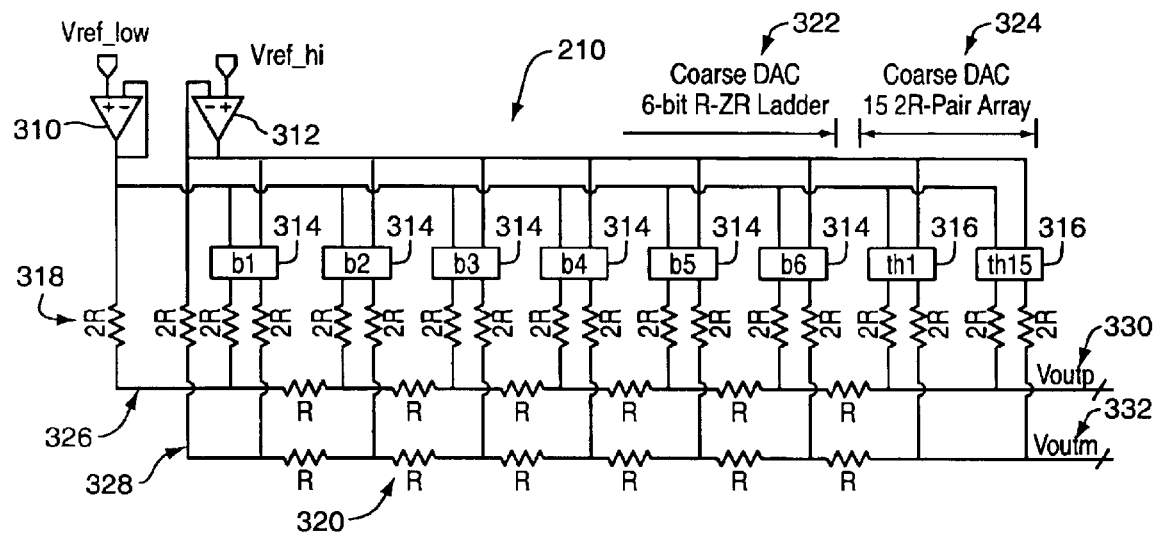
FIG. 3 is a diagram of a differential digital-to-analog converter in accordance with one embodiment of the present invention.
Figure 4:
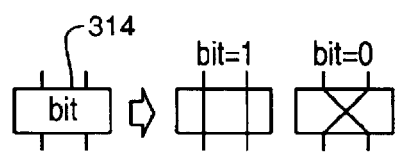
FIG. 4 is a diagram of a bit switch utilized in a differential digital-to-analog converter in accordance with one embodiment of the present invention.

Referring now to FIG. 3, a diagram of a differential digital-to-analog converter in accordance with one embodiment of the present invention will be discussed. In one embodiment of the invention, digital-to-analog converter 210 may utilize a differential R2R architecture to accommodate higher speed applications such as wideband CDMA (WCDMA) although the scope of the invention is not limited in this respect. DAC 210 may include a first input buffer 310 to receive a Vref_low signal and a second input buffer 312 to receive a Vref_hi signal wherein DAC 210 may operate in a differential mode. As shown in FIG. 3, by overlapping and intermixing two R2R ladders, 326 and 328, which are driven by identical voltage references, differential outputs 330 and 332 of DAC 210 may be realized. The switch functions for DAC 210 for bit switches 314 are shown in FIG. 4 to provide complementary voltage division between Vref_hi and Vref_low. In one embodiment of the invention, DAC 210 may be a 10-bit digital-to-analog converter with 4/6 segmentation, although the scope of the invention is not limited in this respect. In such an embodiment, coarse DAC segment 324 of DAC 210 may consist of an array of 15 identical 2R-pairs selected by a thermometer code using thermometer code switches 316 to provide a most significant bit (MSB) section. The 6-bit least significant bit (LSB) section may be a fine DAC differential R2R ladder segment 322 in which the nominal values of resistors in the vertical portion 318 may have a value of 2R and the resistors in the horizontal portion 320 may have a value of R, although the scope of the invention is not limited in this respect.

Figure 5:
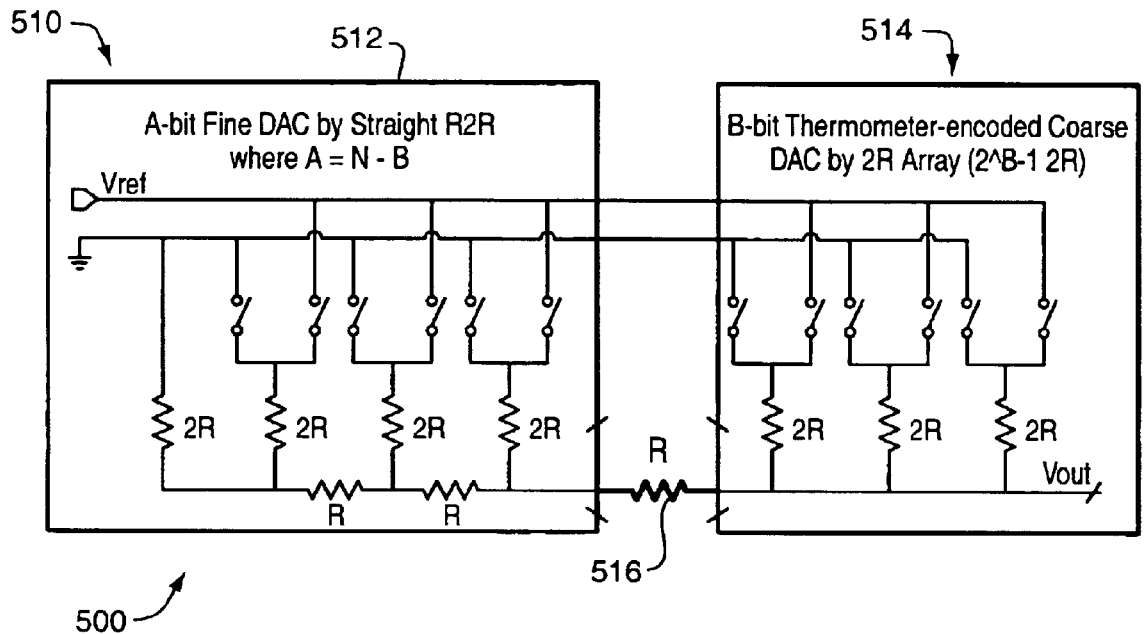
FIG. 5 is a diagram of a segmentation scheme for a differential digital-to-analog converter in accordance with one embodiment of the present invention.

Referring now to FIG. 5, a diagram of a segmentation scheme for a differential digital-to-analog converter in accordance with one embodiment of the present invention will be discussed. The segmentation scheme 500 of FIG. 5 may be utilized to reduce large switch transients and glitch energy at the output or outputs of an R2R digital-to-analog converter such as DAC 210. Segmentation scheme 500 may be utilized for single-ended digital-to-analog converters as well as for differential voltage-mode R2R digital-to-analog converters. In addition there is no limit on the segmentation percentage which may be, for example, 4/6 for a 10-bit DAC, 5/7 or 6/6 for a 12-bit DAC, and so on, without limiting the scope of the invention. As shown in FIG. 5 using a single-ended N-bit R2R digital-to-analog converter as an example, digital-to-analog converter 510 may be segmented into a B/A ratio where B bits are for a most significant bit portion (MSB) 514, and A bits are for a least significant bit (LSB) 512, although the scope of the invention is not limited in this respect. In one embodiment, the MSB B-bits are thermometer encoded, and the LSB A-bits utilize an R2R ladder structure. For example, where DAC 510 is a 10-bit DAC, A=6 and B=4, although the scope of the invention is not limited in this respect. To provide a voltage division scheme, an impedance element 516 may be disposed between the boundary of segment 512 and segment 514. In one particular embodiment impedance element may be a resistor having a value R where R is the value R of an R2R DAC, although the scope of the invention is not limited in this respect. The segmentation scheme 500 of FIG. 5 may help to insure that any matching requirements for MSB portion 514 is shared among $2^B$ resistors instead of a single MSB resistor, and that the glitch energy may be reduced by $2^B$ times compared with a straight R2R ladder implementation, although the scope of the invention is not limited in this respect.

Figure 6:
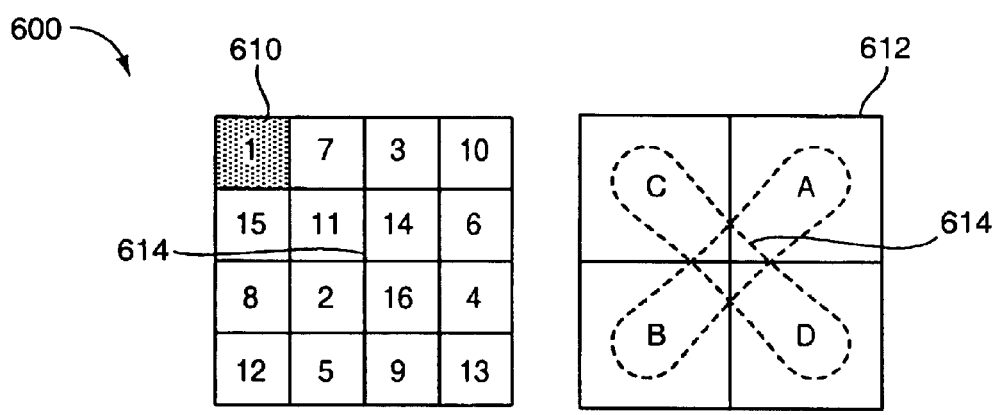
FIG. 6 is a diagram of a random mixing layout for a differential digital-to-analog converter in accordance with one embodiment of the present invention.

Referring now to FIG. 6, is a diagram of a random mixing layout for a differential digital-to-analog converter in accordance with one embodiment of the present invention will be discussed. The layout scheme 600 shown in FIG. 6 illustrates one embodiment of a layout of an integrated circuit on which DAC 210 may be fabricated. To make the differential outputs 330 and 332 of DAC 210 immune to process variations and mismatch due to the differential architecture of DAC 210, for example where DAC 210 is realized in a complementary metal oxide semiconductor (CMOS) process, the R2R ladders 326 and 328 may be intermixed on the die using layout scheme 600. By utilizing such a layout, performance of DAC 210 may be similar to that of a single-ended DAC with the advantage of having differential outputs 330 and 332 available for further processing in the analog baseband transmitter path 144 of transceiver 100 without requiring or using single-to-differential conversion, although the scope of the invention is not limited in this respect. The layout scheme 600 illustrates a layout for a 10-bit DAC using a 4/6 segmentation ratio, in which a 15 2R pair array in an MSB portion 514 of DAC 210 is shown, although the scope of the invention is not limited in this respect.

As shown in FIG. 6, a first area 610 may be a dummy area for matching purposes. The expanded diagram of fourth area 612 illustrates the resistor layout for one set of the R and 2R resistors of DAC 210. The 2R resistor for the same unary code may be randomly placed, and a minimum common centroid 614 may also be maintained for adjacent unary code. The upper ladder for Voutp output 330 and the lower ladder for Voutm output 332 may be cross-mixed from pair to pair to minimize the differential offset errors that may occur due to variation in the CMOS process. A similar scheme may be provided for LSB portion 512. Thus, resistor A and resistor B may be combined to provide resistor 2R for the upper ladder 326, and resistor C and resistor D may be combined to provide resistor 2R for the lower ladder 328. Layout scheme 600 may be applied to DAC 210 where DAC 210 is a differential voltage mode R2R DAC regardless of segmentation percentage or DAC resolution. Such randomization in the layout scheme 600 for DAC 210 may also help to prevent first-order and second-order systematic errors from accumulating, thereby improving linearity performance, although the scope of the invention is not limited in this respect. In one embodiment of the invention, layout scheme 600 may provide less than 1 LSB differential offset error where DAC 210 is a 10-bit DAC, although the scope of the invention is not limited in this respect.

Figure 7:
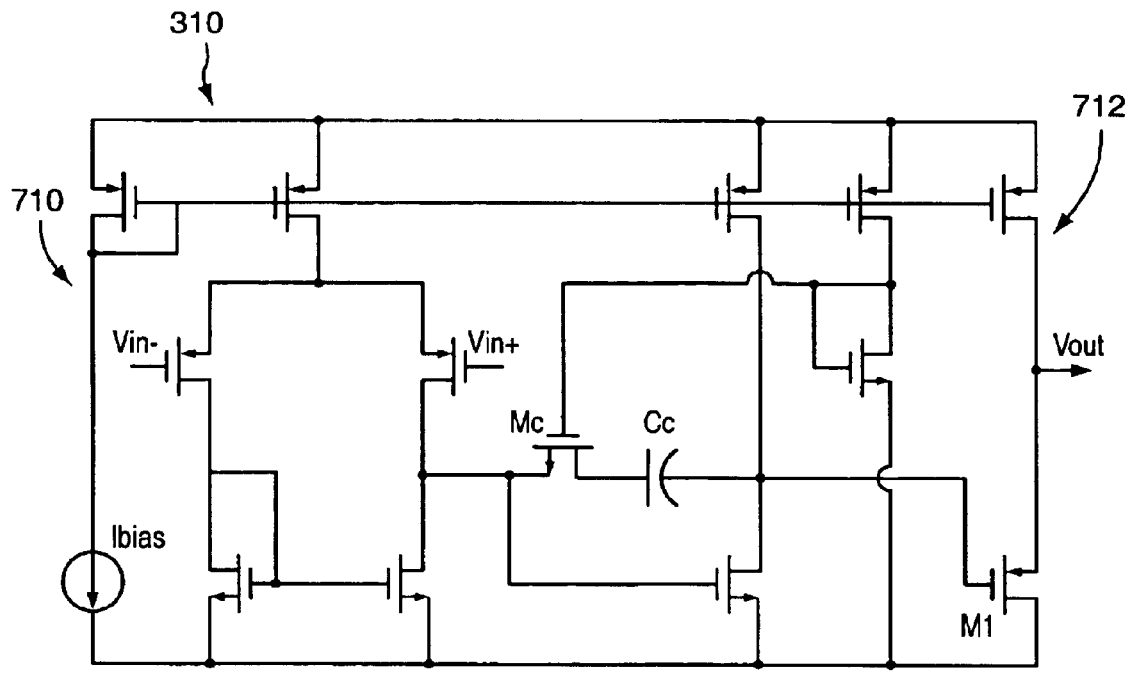
FIG. 7 is a circuit diagram of a reference buffer for a differential digital-to-analog converter in accordance with one embodiment of the present invention.

Referring now to FIG. 7 a circuit diagram of a reference buffer for a differential digital-to-analog converter in accordance with one embodiment of the present invention will be discussed. As shown in FIG. 7, an input buffer circuit 310 may include a PMOS input stage 710 and a PMOS source follower stage 712 to provide a current-sinking input buffer of DAC 210. For current-sourcing input buffer 312, a complementary topology to circuit 310 using an NMOS input stage and an NMOS source follower may be likewise utilized (not shown). Such a complementary topology may realize a higher gain bandwidth with an optimal current consumption and silicon area for higher speed applications such as WCDMA, without being limited by any intrinsic translinear loop stability of the output stage using a class AB amplifier, although the scope of the invention is not limited in this respect.

Figure 8:
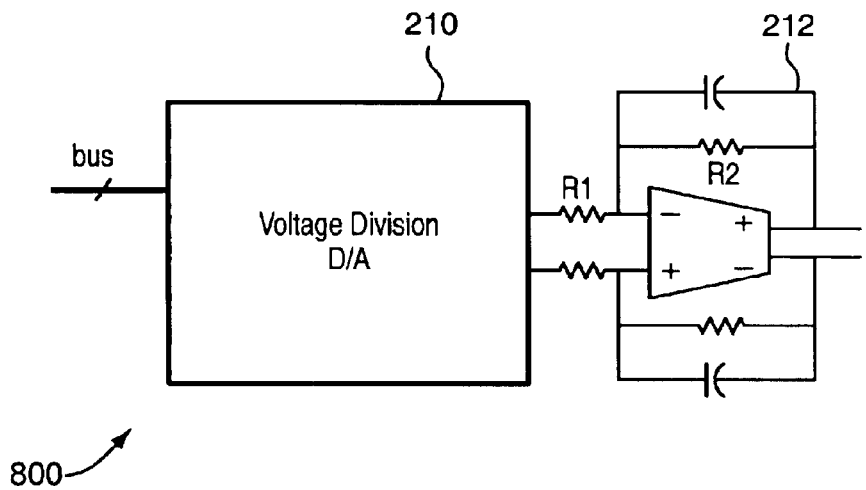
FIG. 8 is a diagram of an analog baseband transmitter path that includes a differential digital-to-analog converter and a direct coupled filter in accordance with one embodiment of the present invention.

Referring now to FIG. 8, a diagram of an analog baseband transmitter path that includes a differential digital-to-analog converter and a direct coupled filter in accordance with one embodiment of the present invention will be discussed. As shown in FIG. 8, DAC 210 may be directly coupled to filter 212 without requiring any buffering of the output of DAC 210. In one embodiment of the invention, DAC 210 may be a voltage division digital-to-analog converter, and filter 212 may be an active RC filter, although the scope of the invention is not limited in this respect. To allow such direct coupling of DAC 210 and filter 212, the DC gain of filter 212 may be adjusted, for example by adjusting the ratio of resistor R2 to resistor R1, although the scope of the invention is not limited in this respect. The adjustment of the DC gain of filter 212 may compensate for any change in the close-loop gain in the transmit path between DAC 210 and filter 212 in order to provide a desired transmit path gain. By utilizing direct coupling of DAC 210 and filter 212, the power consumption and any signal distortion of DAC 138 and modulator 140 may be reduced, although the scope of the invention is not limited in this respect.

Although the invention has been described with a certain degree of particularity, it should be recognized that elements thereof may be altered by persons skilled in the art without departing from the spirit and scope of the invention. It is believed that the differential digital-to-analog converter of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof, and further without providing substantial change thereto. It is the intention of the claims to encompass and include such changes.

What is claimed is:

1. An apparatus, comprising:
   a first segment comprising a first and second ladders and having a differential input, wherein the first ladder is coupled to a current sourcing input buffer, and wherein the second ladder is coupled to a current sinking buffer;
   a second segment coupled to said first segment and having a differential output; and
   at least one or more switches coupled between said first and second ladders to switch between said first and second ladders;
   wherein a differential digital signal received at the differential input is converted to a differential analog signal at the differential output.

2. An apparatus as claimed in claim 1, wherein said first segment is a least significant bit section.

3. An apparatus as claimed in claim 1, wherein said second segment is a most significant bit section.

4. An apparatus as claimed in claim 1, wherein the first and second ladders comprise R2R ladders.

5. An apparatus as claimed in claim 1, wherein said second segment comprises 2R pair array.

6. An apparatus as claimed in claim 1, further comprising an impedance element to couple said first segment and said second segment.

7. An apparatus as claimed in claim 1, wherein the first and second ladders comprise R2R ladders and said second segment comprises a 2R pair array, said apparatus further comprising a resistor having a nominal value of R to couple said first segment and said second segment.

8. An apparatus as claimed in claim 1, wherein the first and second ladders comprise R2R ladders and said second segment comprises a 2R pair array, and wherein resistors of the first ladder are cross mixed with resistors of the second ladder on an integrated circuit.

9. An apparatus as claimed in claim 1, further comprising a filter coupled to the differential output, wherein said filter has a gain sufficient to not require a buffer between the differential output and the filter.

10. An apparatus, comprising:
    a transceiver; and
    an omnidirectional antenna coupled to said transceiver;
    said transceiver including a digital-to-analog converter comprising:
      a first segment comprising a first and second ladders and having a differential input, wherein the first ladder is coupled to a current sourcing input buffer, and wherein the second ladder is coupled to a current sinking buffer;
      a second segment coupled to said first segment and having a differential output; and
      at least one or more switches coupled between said first and second ladders to switch between said first and second ladders;
      wherein a differential digital signal received at the differential input is converted to a differential analog signal at the differential output.

11. An apparatus as claimed in claim 10, wherein said first segment is a least significant bit section.

12. An apparatus, as claimed in claim 10, wherein said second segment is a most significant bit section.

13. An apparatus as claimed in claim 10, wherein the first and second ladders comprise R2R ladders.

14. An apparatus as claimed in claim 10, wherein said second segment comprises 2R pair array.

15. An apparatus as claimed in claim 10, further comprising an impedance element to couple said first segment and said second segment.

16. An apparatus as claimed in claim 10, wherein the first and second ladders comprise R2R ladders and maid second segment comprises a 2R pair array, said apparatus further comprising a resistor having a nominal value of R to couple said first segment and said second segment.

17. An apparatus as claimed in claim 10, wherein the first and second ladders comprise R2R ladders and said second segment comprises a 2R pair array, and wherein resistors of the first ladder are cross mixed with resistors of the second ladder on an integrated circuit.

18. An apparatus as claimed in claim 10, further comprising a filter coupled to the differential output, wherein said filter has a gain sufficient to not require a buffer between the differential output and the filter.

* * * * *